United States Patent
Rizzo et al.

(10) Patent No.: US 7,635,902 B2
(45) Date of Patent: Dec. 22, 2009

(54) LOW POWER MAGNETOELECTRONIC DEVICE STRUCTURES UTILIZING ENHANCED PERMEABILITY MATERIALS

(75) Inventors: Nicholas D. Rizzo, Gilbert, AZ (US); Renu Dave, Chandler, AZ (US); Jon M. Slaughter, Tempe, AZ (US); Srinivas V. Pietambaram, Chandler, AZ (US)

(73) Assignee: Everspin Technologies, Inc., Chandler, AZ (US)

( * ) Notice: Subject to any disclaimer, the term of this patent is extended or adjusted under 35 U.S.C. 154(b) by 133 days.

(21) Appl. No.: 11/867,189

(22) Filed: Oct. 4, 2007

(65) Prior Publication Data

US 2008/0017939 A1 Jan. 24, 2008

Related U.S. Application Data

(62) Division of application No. 11/066,884, filed on Feb. 24, 2005, now Pat. No. 7,285,835.

(51) Int. Cl.
*H01L 29/82* (2006.01)
(52) U.S. Cl. ............... 257/421; 257/295; 257/E27.006; 438/3; 977/838; 977/933; 365/171
(58) Field of Classification Search ............... 257/421, 257/295, E27.006; 438/3; 977/838, 933; 365/171
See application file for complete search history.

(56) References Cited

U.S. PATENT DOCUMENTS

| | | | |
|---|---|---|---|
| 3,691,541 A | 9/1972 | Bruder | |
| 5,721,553 A | 2/1998 | James | |
| 6,233,126 B1 | 5/2001 | Van der Zaag et al. | |
| 6,238,731 B1 | 5/2001 | Ruigrok et al. | |
| 6,778,433 B1 * | 8/2004 | Tang | 365/173 |
| 2001/0030886 A1 * | 10/2001 | Thewes et al. | 365/158 |
| 2002/0191352 A1 | 12/2002 | Nakamoto et al. | |
| 2003/0047728 A1 | 3/2003 | Chen | |
| 2004/0175846 A1 | 9/2004 | Anthony | |
| 2004/0183048 A1 | 9/2004 | Kobayashi et al. | |
| 2005/0162970 A1 * | 7/2005 | Motoyoshi et al. | 365/232 |

OTHER PUBLICATIONS

Yu et al., "Structure and Magnetic Properties of SiO2 Coated Fe2O3 Nanoparticles Synthesized by Chemical Vapor Condensation Process," Rev. Adv. Mater. Sci. 4 (2003) pp. 55-59.

(Continued)

*Primary Examiner*—Tu-Tu V Ho
(74) *Attorney, Agent, or Firm*—Ingrassia, Fisher & Lorenz, P.C.

(57) ABSTRACT

Low power magnetoelectronic device structures and methods for making the same are provided. One magnetoelectronic device structure (100) comprises a programming line (104), a magnetoelectronic device (102) magnetically coupled to the programming line, and an enhanced permeability dielectric material (106) disposed adjacent the magnetoelectronic device. The enhanced permeability dielectric material has a permeability no less than approximately 1.5.

A method for making a magnetoelectronic device structure is also provided. The method comprises fabricating a magnetoelectronic device (102) and depositing a conducting line (104). A layer of enhanced permeability dielectric material (106) having a permeability no less than approximately 1.5 is formed, wherein after the step of fabricating a magnetoelectronic device and the step of depositing a conducting line, the layer of enhanced permeability dielectric material is situated adjacent the magnetoelectronic device.

8 Claims, 3 Drawing Sheets

OTHER PUBLICATIONS

Kumar et al., "Synthesis and Atomic-Level Characterization of Ni Nanoparticles in Al2O3 Matrix," Applied Physics Letters, vol. 81, No. 22, Nov. 25, 2002, pp. 4204-4206.

Kumar et al., "Self-Assembled Epitaxial and Polycrystalline Magnetic Nickel Nanocrystallites," Applied Physics Letters, vol. 79, No. 17, Oct. 22, 2001, pp. 2817-2819.

* cited by examiner

LOW POWER MAGNETOELECTRONIC DEVICE STRUCTURES UTILIZING ENHANCED PERMEABILITY MATERIALS

CROSS REFERENCE TO RELATED APPLICATION

This application is a divisional of U.S. Ser. No. 11/066,884 filed on Feb. 24, 2005.

FIELD OF THE INVENTION

The present invention generally relates to magnetoelectronic devices, and more particularly relates to low power magnetoelectronic device structures that utilize enhanced permeability materials.

BACKGROUND OF THE INVENTION

Magnetoelectronics, spin electronics and spintronics are synonymous terms for the use of effects predominantly caused by electron spin. Magnetoelectronics is used in numerous information devices, and provides non-volatile, reliable, radiation resistant, and high-density data storage and retrieval. The numerous magnetoelectronic information devices include, but are not limited to, Magnetoresistive Random Access Memory (MRAM), magnetic sensors, and read/write heads and hard disks for disk drives.

A magnetoelectronics information device, such as an MRAM, typically includes an array of memory elements. Each memory element typically has a structure that includes multiple magnetic layers separated by various non-magnetic layers. Information is stored as directions of magnetization vectors in the magnetic layers. Magnetic vectors in one magnetic layer are magnetically fixed or pinned, while the magnetization direction of another magnetic layer is free to switch between the same and opposite directions that are called "parallel" and "antiparallel" states, respectively. In response to parallel and antiparallel states, the magnetic memory element represents two different resistances. The measured resistance of the magnetic memory element has minimum and maximum values when the magnetization vectors of the two magnetic layers point in substantially the same and opposite directions, respectively. Accordingly, a detection of change in the measured resistance allows a magnetoelectronics information device, such as an MRAM device, to provide information stored in the magnetic memory element.

Typically, a memory element is programmed by a magnetic field created by current flowing through one or more conductors, or programming lines, disposed proximate to the memory element. To program the memory element, the magnetic field applied by the programming line is of sufficient magnitude to switch the direction of the magnetic vectors of one or more magnetic layers of the memory element. Lower programming line currents are desirable to reduce power consumption. Lower programming line currents also translate into smaller write circuits resulting in smaller and less expensive memory array devices. There is an ever-increasing demand for smaller and lower power memory devices.

Accordingly, it is desirable to provide a magnetoelectronic device structure that requires low power for programming. In addition, it is desirable to provide an MRAM device structure that utilizes enhanced magnetic permeability (hereinafter, referred to as "enhanced permeability") materials for reducing the current required to program a memory element of the MRAM device structure. It also is desirable to provide a method for fabricating a dielectric material having enhanced permeability. Furthermore, other desirable features and characteristics of the present invention will become apparent from the subsequent detailed description of the invention and the appended claims, taken in conjunction with the accompanying drawings and this background of the invention.

BRIEF DESCRIPTION OF THE DRAWINGS

The present invention will hereinafter be described in conjunction with the following drawing figures, wherein like numerals denote like elements.

DETAILED DESCRIPTION OF THE INVENTION

The following detailed description of the invention is merely exemplary in nature and is not intended to limit the invention or the application and uses of the invention. Furthermore, there is no intention to be bound by any theory presented in the preceding background of the invention, or the following detailed description of the invention.

Figure 1:
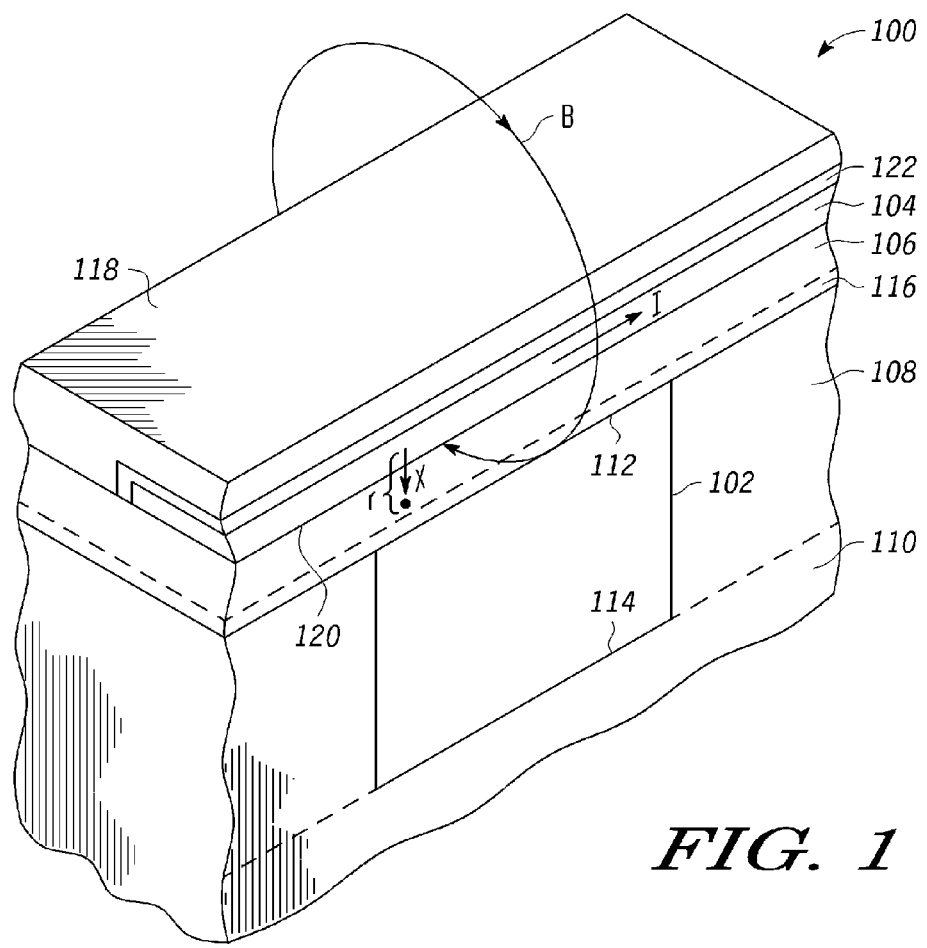
FIG. 1 is a cross-sectional view of a magnetoelectronic device structure in accordance with an exemplary embodiment of the present invention.

Referring to FIG. 1, in accordance with one embodiment of the present invention, a magnetoelectronic device structure 100 comprises a magnetoelectronic device 102 and a conductive programming line 104 disposed proximate to the magnetoelectronic device 102. Magnetoelectronic device 102 may comprise any suitable magnetoelectronic device including, for example, a magnetic sensor or magnetoresistive memory element. Examples of a magnetoelectronic device 102 include a magnetic tunnel junction (MTJ) device or a giant magnetoresistive (GMR) device. Conductive programming line 104 may be formed of any conductive material that is suitable for carrying a current I and is disposed sufficiently close to magnetoelectronic device 102 such that when a current I is carried by conductive programming line 104, the current creates a circumferential magnetic field B about conductive programming line 104 that may be sufficient to change the state of magnetoelectronic device 102. For discussion purposes, conductive programming line 104 is illustrated in FIG. 1 disposed above magnetoelectronic device 102. However, it will be appreciated that conductive programming line 104 may be disposed below magnetoelectronic device 102 or at any other suitable position relative to magnetoelectronic device 102 such that circumferential magnetic field B may be sufficient to change the state of magnetoelectronic device 102.

Disposed between the magnetoelectronic device 102 and the conductive programming line 104 is a first dielectric material layer 106. A second dielectric material layer 108 is disposed about magnetelectronic device 102. Second material layer 108 may be formed about magnetoelectronic device 102 after fabrication of magnetoelectronic device 102 or may be deposited and etched prior to fabrication of magnetoelectronic device 102, such as during a damascene process. A third dielectric material layer 110 is disposed at a surface 114 of magnetoelectronic device 102 that is opposite a surface 112 proximate to dielectric material layer 106. A fourth dielectric material layer 118 is disposed about conductive programming line 104.

As described above, the magnetic flux B that is applied to magnetoelectronic device 102 from conductive programming line 104 may be of a sufficient magnitude that the state of the magnetoelectronic device 102 may be changed. As is well known in the semiconductor industry, using Ampere's Law, the magnetic field B generated at a point X by current I through conductive programming line 104 may be represented approximately by the equation:

$$B(r) \approx \frac{\mu \times I}{2\pi r},$$

where $\mu$ is the permeability of each of the dielectric material layers 106, 108, 110, and 118 and "r" is the distance from point X to the center of conductive programming line 104. For simplicity, it is assumed that conductive programming line 104 has a circular symmetry and that dielectric material layers 106, 108, 110, and 118 have the same permeability $\mu$. Most non-ferromagnetic materials, including most insulating dielectric materials, have a permeability that is approximately equal to 1. By increasing the permeability of one or more of the dielectric material layer 106, 108, 110, and 118 above 1, the magnetic flux B may be proportionately increased without any increase in current I. Accordingly, by using dielectric material layers having an "enhanced permeability," that is, a permeability greater than about 1, a lower current I may be required to produce magnetic field B. In this manner, a low power magnetoresistive memory element may be fabricated. Examples of methods for achieving "enhanced permeability" are described below.

In an exemplary embodiment of the present invention, magnetoelectronic device structure 100 comprises a first dielectric material layer 106 that has enhanced permeability. In one embodiment of the invention, first dielectric material layer 106 has an enhanced permeability no less than 1.5. In a preferred embodiment of the invention, first dielectric material layer 106 has an enhanced permeability in the range of about 2 to about 60. In a more preferred embodiment of the invention, first dielectric material layer 106 has an enhanced permeability in the range of from about 2 to about 20.

In another exemplary embodiment of the invention, additional material layers 116, represented by dashed lines in FIG. 1, may be disposed between conductive programming line 104 and magnetoelectronic device 102. For example, one or more dielectric material layers in addition to first dielectric material layer 106 may be disposed between conductive programming line 104 and magnetoelectronic device 102. Alternatively, one or more conductive layers may be disposed between conductive programming line 104 and magnetoelectronic device 102. In one exemplary embodiment of the present invention, the additional material layer(s) also exhibits an enhanced permeability that is no less than about 1.5. For example, a metallic layer of tantalum or other metal doped with magnetic particles, such as iron particles, could be deposited between the programming line 104 and the magnetoelectronic device 102. In a preferred embodiment of the invention, the additional layer(s) has a permeability in the range of about 2 to about 60. More preferably, the additional layer(s) has a permeability in the range of from about 2 to about 20. While additional material layer 116 is illustrated in FIG. 1 underlying first dielectric material layer 106, it will be appreciated that additional material layer 116 may be disposed overlying first dielectric material layer 106 or between two dielectric material layers 106.

In a further exemplary embodiment, second material layer 108 that has been formed about magnetoelectronic device 102 or within which magnetoelectronic device 102 has been formed may exhibit an enhanced permeability. When material layer 108 exhibits an enhanced permeability, first material layer 106 may or may not exhibit an enhanced permeability. It will be appreciated that second material layer 108 may be a layer separate from dielectric material layer 106 or may be integral with dielectric material layer 106. Material layer 108 may comprise one layer or a plurality of layers, one or more of which exhibits relative permeability greater than about 1.5.

In a further exemplary embodiment, second material layer 108 and third material layer 110 may exhibit an enhanced permeability such that magnetoelectronic device 102 is at least partially surrounded by material exhibiting an enhanced permeability that is greater than about 1.5. Third material layer 110 may be a layer separate from second material layer 108 or may be integral with second material layer 108.

In another exemplary embodiment, fourth material layer 118 disposed about conductive programming line 104 may exhibit an enhanced permeability. Material layer 118 may comprise one layer or a plurality of layers, one or more of which exhibits permeability greater than about 1.5. Preferably, however, conductive programming line 104 is surrounded on all surfaces, except for a surface 120 most proximate to magnetoelectronic device 102, by a ferromagnetic cladding layer 122. Ferromagnetic cladding layers 122 are well known in the semiconductor industry. Ferromagnetic cladding layer 122 has high intrinsic permeability so that the magnetic field is concentrated in the cladding layer rather than fourth material layer 118. In this manner, the magnetic field below conductive programming line 104 for a given current I may be increased by a factor of 2, with the magnetic field in fourth material layer 118 reduced to approximately zero. Accordingly, fourth material layer 118 may have standard permeability, that is, $\mu=\mu_0=1$.

It will be appreciated that, in a preferred embodiment of the invention, material layers 106, 108 and 110 each have enhanced permeability. The permeability may be the same for each of the layers or the permeability may vary among the layers. In this regard, again using Ampere's Law, the magnetic field at point X may be indicated by the equation:

$$B(r) \approx \frac{\mu \times I}{2\pi r} \times \left(\frac{2\mu}{\mu+1}\right),$$

assuming material layers 106, 108, and 110 each have the same permeability $\mu$ and fourth material layer 118 has standard permeability. Thus, magnetic field B(r) at point X is enhanced by the factor of $2\mu/(\mu+1)$ due to the enhanced permeability of material layers 106, 108, and 110. However, this magnetic field is $2/(\mu+1)$ times smaller than if fourth material layer 118 also had enhanced permeability $\mu$. Accordingly, in a more preferred embodiment of the invention, material layers 106, 108, 110, and 118 each exhibit enhanced permeability, which permeability may be the same for each of the layers or may differ among the layers. In a most preferred embodiment of the invention, material layers 106, 108, and 110 each exhibit enhanced permeability, material layer 118 exhibits standard permeability, that is, $\mu=\mu_0=1$, and programming line 104 is surrounded on three sides by cladding layer 122 so that the magnetic field B(r) at point X is enhanced by the factor of μ.

Figure 2:
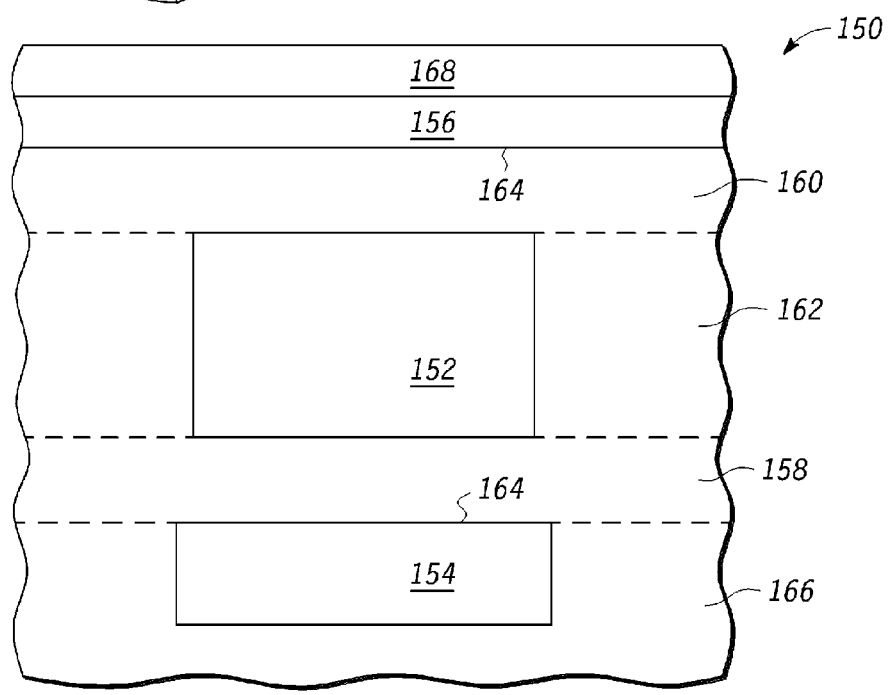
FIG. 2 is a cross-sectional view of a magnetoelectronic device structure in accordance with another exemplary embodiment of the present invention.

FIG. 2 illustrates a magnetoelectronic device structure 150 in accordance with another exemplary embodiment of the present invention. Magnetoelectronic device structure 150 includes a magnetoresistive memory element 152, which may comprise, for example, a magnetic tunnel junction (MTJ) device or a giant magnetoresistive (GMR) device. Magnetoelectronic device structure 150 further comprises a first conductive programming line, referred to herein as digit line 154, disposed below magnetoresistive memory element 152 and a second conductive programming line, referred to herein as bit line 156. Bit line 156 is disposed above magnetoresistive memory element 152 and orthogonal to digit line 154. While for discussion purposes digit line 154 is illustrated in FIG. 2 below magnetoresistive memory element 152 and bit line 156 is illustrated in FIG. 2 above magnetoresistive memory element 152, it should be understood that the opposite positioning may also be utilized, that is, bit line 156 may be disposed underlying magnetoresistive memory element 152 and digit line 154 may be disposed overlying magnetoresistive memory element 152.

In one embodiment of the invention, a first dielectric material layer 158 exhibiting an enhanced permeability no less than about 1.5 may be disposed between digit line 154 and magnetoresistive memory element 152. In another embodiment of the invention, a second dielectric material layer 160 exhibiting an enhanced permeability no less than about 1.5 may be disposed between bit line 156 and magnetoresistive memory element 152. In a further embodiment of the invention, both layer 158 and layer 160 exhibit an enhanced permeability no less than about 1.5. First dielectric material layer 158 and second dielectric material layer 160 may each comprise one layer or a plurality of layers, one or more of which exhibit relative permeability no less than about 1.5. In a preferred embodiment of the invention, first dielectric material layer 158 and/or second dielectric material layer 160 may exhibit a relative permeability in the range of about 2 to about 60. More preferably, first dielectric material layer 158 and/or second dielectric material layer 160 may exhibit a permeability in the range of from about 2 to about 20.

In another exemplary embodiment, a third material layer 162 that has been formed about magnetoresistive memory element 152 or within which magnetoresistive memory element 152 has been formed also may exhibit an enhanced relative permeability no less than about 1.5. In this manner, magnetoresistive memory element 152 may be partially or completely surrounded by material with enhanced permeability so that magnetoresistive memory element 152 may experience enhanced magnetic field from both digit line 154 and bit line 156 without an increase in the current directed through digit line 154 and/or bit line 156. Third material layer 162 may comprise one layer or a plurality of layers, one or more of which exhibits enhanced permeability. In addition, material layer 162 may be a layer separate from first dielectric material layer 158 and/or second dielectric material layer 160 or may be integral with first dielectric material layer 158 and/or second dielectric material layer 160. In a preferred embodiment of the invention, dielectric material layer 162 may exhibit a permeability in the range of about 2 to about 60. More preferably, dielectric material layer 162 may exhibit a permeability in the range of from about 2 to about 20.

In a preferred embodiment of the invention, both digit line 154 and bit line 156 are surrounded at all surfaces, except the surfaces 164 most proximate to memory element 152, by ferromagnetic cladding layers (not shown), as are well known. In this regard, it is not necessary to have materials with enhanced permeability disposed about the cladded surfaces of digit line 154 and bit line 156. However, it will be appreciated that, as described above, in the absence of cladding layers, a material layer (or layers) 166 disposed about digit line 154 may exhibit enhanced permeability. Similarly, a material layer (or layers) 168 disposed about bit line 156 may exhibit enhanced permeability.

Figure 3:
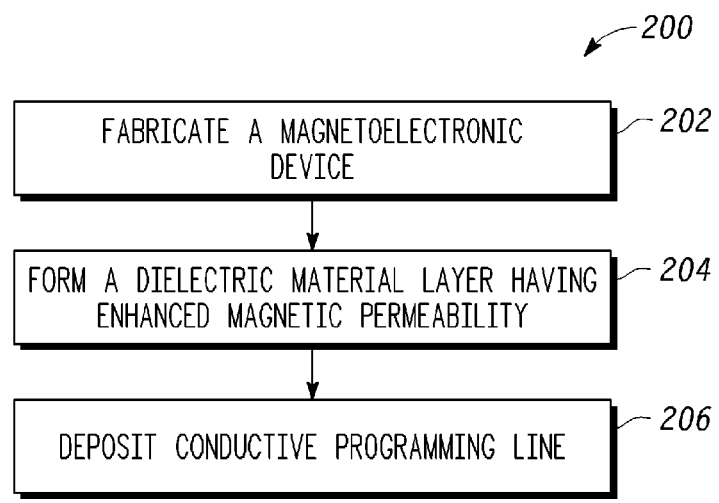
FIG. 3 is a flow chart of a method for fabricating a magnetoelectronic device structure in accordance with another exemplary embodiment of the present invention.

A method 200 for fabricating a magnetoelectronic device structure, such as the magnetoelectronic device structure 100 of FIG. 1, is illustrated in the flow chart of FIG. 3. For sake of convenience, the method 200 will be described with reference to a magnetoelectronic device structure in which a programming line is fabricated above a magnetoelectronic device, with an enhanced permeability dielectric material layer disposed therebetween. However, it should be appreciated that the method 200 is not so limited, and may be utilized to fabricate a magnetoelectronic device structure comprising a magnetoelectronic device disposed above, or along side of, a programming line, with enhanced permeability material disposed adjacent to the magnetoelectronic device and/or the programming line.

Method 200 of FIG. 3 may commence by fabricating a magnetoelectronic device, such as magnetoelectronic device 102 of FIG. 1 (step 202). The magnetoelectronic device may be fabricated by any suitable methods or practices known in the semiconductor industry. For example, the magnetoelectronic device may be formed by a damascene or other similar process in which the various layers and structures of the magnetoelectronic device are deposited in a trench formed within a dielectric material. Alternatively, the various layers and structures of the magnetoelectronic device may be formed on a dielectric material or other substrate and suitably etched to form the magnetoelectronic device. In one embodiment of the invention, the magnetoelectronic device is fabricated such that the material disposed proximate to a bottom surface and side surfaces of the magnetoelectronic device exhibits enhanced permeability, as described in more detail below.

After fabrication of the magnetoelectronic device, a dielectric material layer that exhibits enhanced magnetic permeability is formed overlying the magnetoelectronic device (step 204). The enhanced permeability dielectric material layer may be formed by any suitable process or procedure, such as, for example, plasma vapor deposition (PVD), ion beam deposition (IBD), chemical vapor deposition (CVD), evaporation deposition, and the like. Preferably, the dielectric material layer is formed by a process or procedure that does not utilize temperatures greater than 500° C. Temperatures above 500° C. may degrade the magnetic properties of the materials that comprise the magnetoelectronic device.

In accordance with one embodiment of the present invention, the enhanced permeability dielectric material may be formed by the method of co-sputtering utilizing at least one dielectric material source and at least one magnetic material source. Co-sputtering is a well-known process and thus will not be described in detail here. The dielectric material source may comprise any suitable dielectric, such as alumina ($AlO_x$), where X may be any number greater than zero, silicon oxide, silicon dioxide, oxides of magnesium, hafnium tantalum, titanium vanadium, or niobium, and the like. The source or sources of magnetic material may comprise any suitable magnetic material, such as, for example, nickel, iron, cobalt, and/or alloys of nickel, iron and/or cobalt, including nickel-iron, cobalt-iron, cobalt-iron-boron, nickel-iron-cobalt, and the like. The relative fluxes of the dielectric material(s) and the magnetic material(s) may be increased or decreased so that an enhanced permeability dielectric material having a desired enhanced magnetic permeability is deposited.

Figure 4:
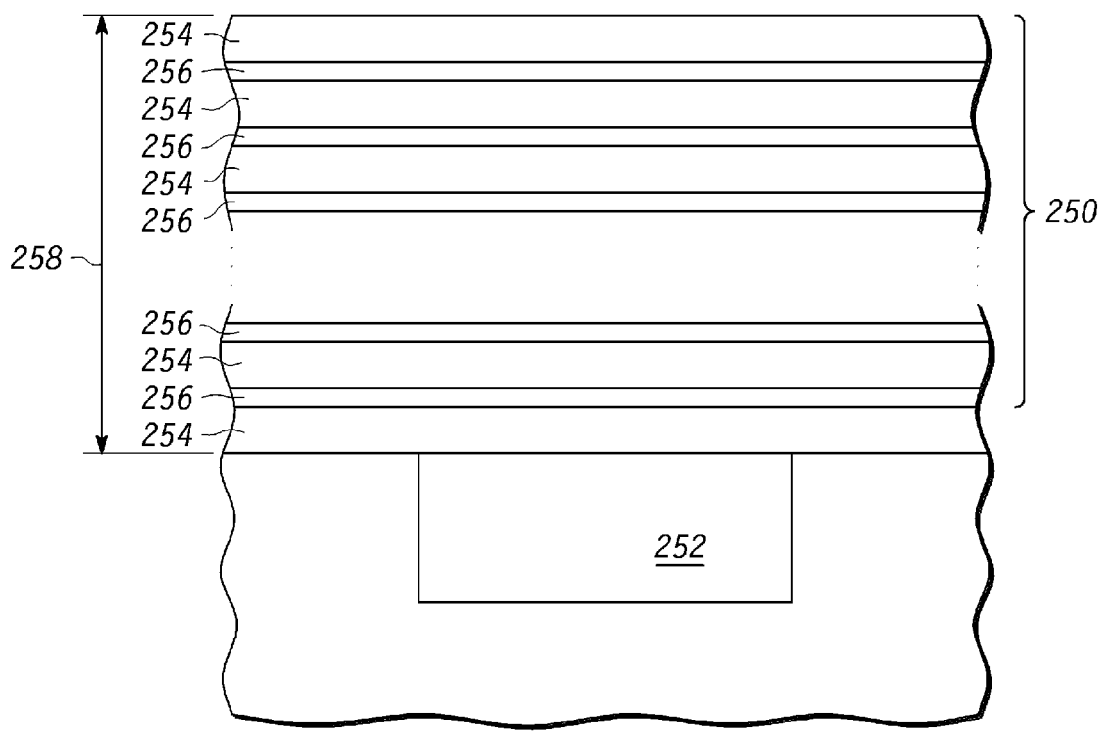
FIG. 4 is a cross-sectional view of a partial magnetoelectronic device structure in accordance with a further exemplary embodiment of the present invention.

Referring to FIG. 4, in another embodiment of the invention, a dielectric material layer 250 that exhibits enhanced permeability no less than about 1.5 may be formed overlying or underlying a magnetoelectronic device 252 by the alternating deposition of a dielectric material (or materials) 254 and magnetic material 256 to form a multilayer stack. The dielectric material(s) may comprise any suitable dielectric material, such as alumina ($AlO_x$), where X may be any number greater than zero, silicon oxide, silicon dioxide, oxides of magnesium, hafnium tantalum, titanium vanadium, or niobium, and the like. The magnetic material(s) may comprise any suitable magnetic material, such as, for example, nickel, iron, cobalt, and/or alloys of nickel, iron and/or cobalt, including nickel-iron, cobalt-iron, cobalt-iron-boron, nickel-iron-cobalt, and the like. The layers of deposited dielectric material 254 may each comprise the same dielectric material, or may comprise different dielectric materials. Similarly, the layers of magnetic material 256 may each comprise the same magnetic material, or may comprise different magnetic materials. The uppermost layer of the resulting enhanced permeability dielectric material layer 250 may comprise either a dielectric material layer 254 or a magnetic material layer 256. The deposition may be performed using any suitable, known process, such as, for example, PVD, IBD, CVD, evaporation deposition, and the like. The alternating deposition of dielectric material layers 254 and magnetic layers 256 is performed until the multilayer stack 250 has a desired or predetermined thickness 258.

In multilayer stack 250, the magnetic layers 256 preferably are deposited such that magnetic nanoparticles form during or after deposition. The nanoparticles are sufficiently small in size that they are superparamagnetic. A magnetic particle is "superparamagnetic" when it's energy barrier to magnetization reversal $E_b$ is comparable to thermal energy $k_bT$ such that $E_b/k_bT \leq 1$, where $k_b$ is Boltzman's constant and T is the temperature of the nanoparticle. When this occurs, the thermal energy effectively demagnetizes the nanoparticle almost instantaneously so that it has zero coercivity and zero magnetic remanence. The energy barrier $E_b$ may be expressed as $E_b=M_SVH_k$, where $M_S$ is the saturation magnetization of the nanoparticle, V is the volume of the nanoparticle, and $H_k$ is the magnetic anisotropy, which is the sum of any intrinsic material anisotropy and any shape anisotropy due to particle shape deviating from spherical. Accordingly, for spherical nanoparticles of Ni, Fe, or Co alloys (Ms~1000 kA/m), where $H_k \leq 20$ Oe, the nanoparticles will be superparamagnetic when the diameter of the nanoparticle is no greater than 20 nm. In one embodiment of the present invention, the nanoparticles have a size in the range of about 2 to about 10 nm. Preferably, the nanoparticles have a size in the range of about 2 to about 5 nm.

It should be appreciated that in a preferred embodiment a layer of nanoparticles is a discontinuous layer of non-joining "islands" or dots of material that maintain super-paramagnetic properties. In other words, the non-joining "islands" or dots of material that maintain superparamagnetic properties may be magnetic particles embedded in a dielectric matrix. In this embodiment, because the deposited magnetic material agglomerates into particles, rather than forming a continuous layer, the height (or diameter) of the particles is much greater than the average thickness of material deposited to form the nanoparticle layer.

The layers of the deposited dielectric material(s) 254 are substantially thicker than the layers of the nanoparticles 256 which lie therebetween. In one embodiment of the invention, the dielectric material layers are about 1 to 15 times thicker than the average thickness of magnetic material deposited to form layers 256. In a preferred embodiment of the invention, the dielectric material layers 254 are about 2 times thicker than the magnetic layers 256.

One example of forming an enhanced permeability dielectric material, in accordance with an exemplary embodiment of the present invention, using the alternating deposition process described above may begin with the reactive sputtering of a dielectric material, such as alumina. In this example, aluminum may be deposited overlying the magnetoelectronic device in the presence of a suitable oxygen flow to form an alumina layer having any suitable stoichiometry such that the alumina layer exhibits insulating dielectric properties. The reactive sputtering process is a well known process and will not be described in detail here. Preferably, the reactive sputtering process is performed at temperatures no greater than 500° C. so that the magnetic properties of the magnetoelectronic devices are not compromised. The reactive sputtering process may proceed until a desired or predetermined thickness of alumina is deposited overlying the magnetoelectronic device. Preferably, the alumina layer has a thickness of less than about 50 angstroms and more preferably has a thickness of about 25 angstroms.

After the deposition of the alumina layer, cobalt-iron (CoFe) nanoparticles exhibiting superparamagnetic properties are formed overlying the alumina layer using PVD. The CoFe is deposited such that a discontinuous layer of CoFe nanoparticles is formed over the alumina layer. Preferably, the PVD process is performed until the discontinuous nanoparticle layer has an average thickness in the range of about 5 to about 20 angstroms.

The reactive sputtering process again is performed to form a second alumina layer overlying the CoFe nanoparticles. The second alumina layer preferably has a thickness that is the same thickness as the first alumina layer, that is, preferably about 25 angstroms. PVD then is performed to form a second discontinuous layer of CoFe nanoparticles overlying the second alumina layer. The second CoFe nanoparticle layer preferably has a thickness that is the same thickness as the first CoFe nanoparticle layer, that is, preferably about 5 to about 20 angstroms. The reactive sputtering process and the PVD process then are repeated alternately to form a multilayer stack having a desired or predetermined thickness. The uppermost layer of the enhanced relative permeability dielectric material may comprise either a discontinuous CoFe layer or an alumina layer.

It will be appreciated that, while the above example began with a reactive sputtering step to deposit a dielectric material layer, followed by a PVD step to deposit a discontinuous nanoparticle layer, the steps could be performed in an alternate sequence. That is, the enhanced relative permeability dielectric material layer, such as dielectric material layer 250 of FIG. 4, may be formed by first depositing a discontinuous nanoparticle layer. Then, a dielectric material layer could be deposited overlying the discontinuous nanoparticle layer. This sequence of steps then could be performed alternately until a multilayer stack having a desired or predetermine thickness is obtained.

Figure 5:
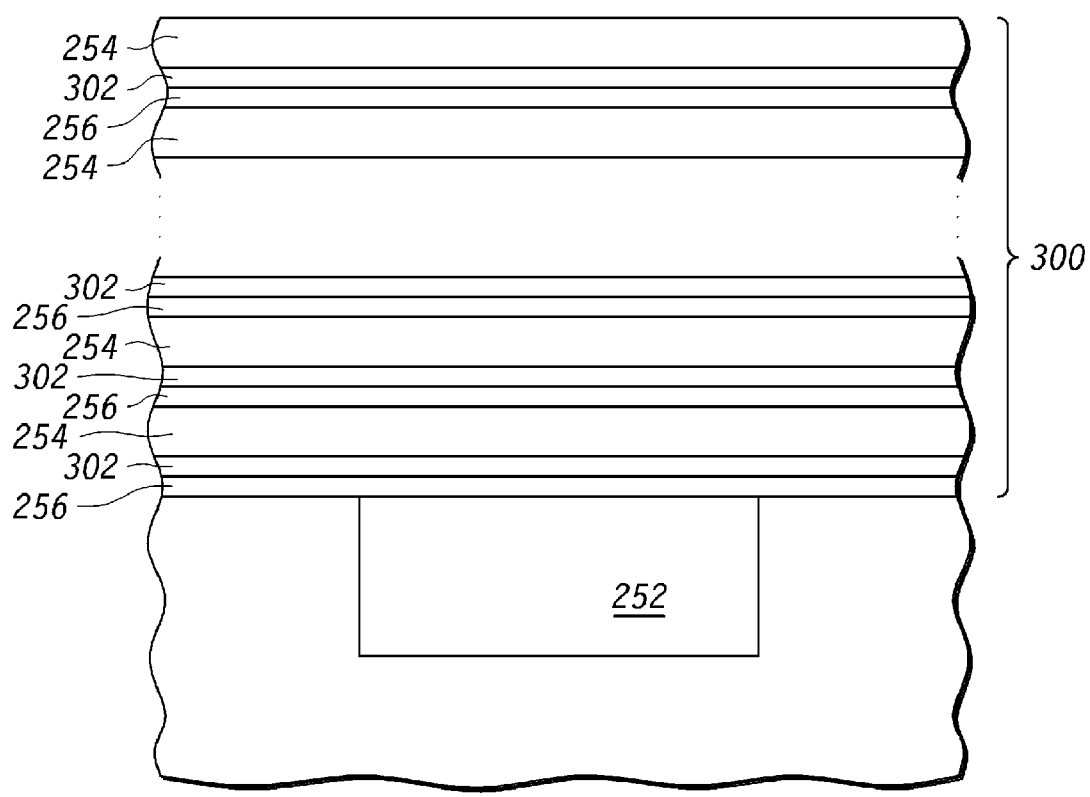
FIG. 5 is a cross-sectional view of a partial magnetoelectronic device structure in accordance with yet another exemplary embodiment of the present invention.

Referring to FIG. 5, in another exemplary embodiment of the invention, an enhanced permeability dielectric material layer 300 may further comprise a material that serves as a barrier to oxidation of the nanoparticle layers 256. In this embodiment, enhanced permeability dielectric material layer 300 may be formed using the alternating deposition of dielectric material layers, such as dielectric material layers 254 of FIG. 4, and discontinuous nanoparticle layers, such as nanoparticle layers 256 of FIG. 4, as described above, but with the additional deposition over each nanoparticle layer 256 of a layer 302 of material that serves as a barrier to oxidation of the nanoparticle layers 256. For example, when the dielectric material 254 comprises alumina, as in the above described example, the oxidation barrier material layers 302 may be, for example, aluminum. As the alumina layers 254 are formed during the reactive sputtering steps, the CoFe nanoparticle layers 256 may be exposed to oxygen. Without an oxidation barrier layer, the CoFe nanoparticle layers may begin to oxidize, which could degrade or otherwise compromise the super-paramagnetic properties of the CoFe nanoparticle layers. An oxidation barrier layer 302 of aluminum overlying each of the CoFe nanoparticle layers may serve to react with any oxygen that may otherwise oxidize the CoFe nanoparticle layers. In addition, upon oxidation, the oxidation barrier layer 302 becomes non-conducting, thus contributing to the insulating dielectric nature of the multilayer stack. In one embodiment, the oxidation barrier layers 302 have a thickness no greater than 20 angstroms. In a preferred embodiment of the invention, the oxidation barrier layers 302 have a thickness in the range of about 5 to about 10 angstroms.

Returning again to FIG. 3, after deposition of the enhanced permeability dielectric material layer overlying the magnetoelectronic device, a conductive programming line may be deposited overlying the dielectric material layer (step 206). The conductive programming line may be formed utilizing any suitable process or procedure known in the semiconductor industry. For example, the conductive programming line may be formed by etching one or more than one conductive material layer deposited overlying the enhanced permeability dielectric material layer. Alternatively, the conductive programming line may be formed by the deposition of a conductive material or materials deposited in a trench etched into the enhanced permeability dielectric material layer or into another insulating material layer deposited overlying the enhanced permeability dielectric material layer.

Accordingly, magnetoelectronic device structures that utilize low power for programming in accordance with the present invention have been described. The magnetoelectronic device structures utilize enhanced permeability dielectric materials that are disposed between a magnetoelectronic information device and a programming line. The enhanced permeability dielectric materials exhibit magnetic permeabilities no less than 1.5. While at least one exemplary embodiment has been presented in the foregoing detailed description of the invention, it should be appreciated that a vast number of variations exist. It should also be appreciated that the exemplary embodiment or exemplary embodiments are only examples, and are not intended to limit the scope, applicability, or configuration of the invention in any way. Rather, the foregoing detailed description will provide those skilled in the art with a convenient road map for implementing an exemplary embodiment of the invention, it being understood that various changes may be made in the function and arrangement of elements described in an exemplary embodiment without departing from the scope of the invention as set forth in the appended claims.

What is claimed is:

1. A magnetoelectronic device structure comprising:
a programming line;
a magnetoelectronic device magnetically coupled to said programming line; and
a first enhanced permeability dielectric material disposed adjacent to said magnetoelectronic device, said first enhanced permeability dielectric material having a magnetic permeability no less than approximately 1.5 and comprising alternating layers of at least one dielectric material and at least one magnetic nanoparticle material that exhibits super-paramagnetic behavior, wherein each of said layers of at least one magnetic nanoparticle material comprises a discontinuous layer of magnetic nanoparticles; and
an oxygen barrier layer overlying each of said layers of at least one magnetic nanoparticle material.

2. The magnetoelectronic device structure of claim 1, said first enhanced permeability dielectric material having a magnetic permeability in the range of about 2 to about 60.

3. The magnetoelectronic device structure of claim 1, said first enhanced permeability dielectric material disposed between said programming line and said magnetoelectronic device.

4. The magnetoelectronic device structure of claim 1, further comprising an additional enhanced permeability material disposed between said magnetoelectronic device and said programming line, said additional enhanced material having a magnetic permeability no less than approximately 1.5.

5. The magnetoelectronic device structure of claim 4, wherein said additional enhanced permeability material is a conductive material.

6. The magnetoelectronic device structure of claim 1, wherein said first enhanced permeability dielectric material is formed from at least one dielectric material selected from the group consisting of alumina, silicon dioxide, silicon nitride, and oxides of magnesium, hafnium, tantalum, titanium, vanadium, and niobium and from at least one magnetic material selected from the group consisting of nickel, iron, cobalt, alloys of nickel, alloys of iron, alloys of cobalt, and combinations thereof.

7. The magnetoelectronic device structure of claim 1, wherein said at least one dielectric material is formed from a material selected from the group consisting of alumina, silicon dioxide, silicon nitride, and oxides of magnesium, hafnium, tantalum, titanium, vanadium, and niobium and wherein said at least one magnetic nanoparticle material comprises a material selected from the group consisting of nickel, iron, cobalt, alloys of nickel, alloys of iron, alloys of cobalt, and combinations thereof.

8. The magnetoelectronic device structure of claim 1, wherein said at least one magnetic nanoparticle material comprises nanoparticles having a size in the range of about 2 nm to about 10 nm.

* * * * *